United States Patent
Pradhan et al.

(10) Patent No.: US 9,112,057 B1
(45) Date of Patent: Aug. 18, 2015

(54) SEMICONDUCTOR DEVICES WITH DOPANT MIGRATION SUPPRESSION AND METHOD OF FABRICATION THEREOF

(71) Applicant: MIE Fujitsu Semiconductor Limited, Kuwana (JP)

(72) Inventors: Sameer Pradhan, San Jose, CA (US); Dalong Zhao, San Jose, CA (US); Lingquan Wang, Los Gatos, CA (US); Pushkar Ranade, Los Gatos, CA (US); Lance Scudder, Sunnyvale, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 109 days.

(21) Appl. No.: 13/622,194

(22) Filed: Sep. 18, 2012

(51) Int. Cl.
| | |
|---|---|
| *H01L 21/76* | (2006.01) |
| *H01L 21/00* | (2006.01) |
| *H01L 21/04* | (2006.01) |
| *H01L 21/22* | (2006.01) |
| *H01L 21/8258* | (2006.01) |
| *H01L 29/10* | (2006.01) |
| *H01L 21/02* | (2006.01) |

(Continued)

(52) U.S. Cl.
CPC ........ *H01L 21/8258* (2013.01); *H01L 21/0243* (2013.01); *H01L 21/02529* (2013.01); *H01L 21/2205* (2013.01); *H01L 29/1079* (2013.01); *H01L 29/167* (2013.01); *H01L 29/78684* (2013.01)

(58) Field of Classification Search
USPC .......... 438/413, 495, 510, 542; 257/E21.111, 257/E21.135, E21.137, E21.446
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

(Continued)

*Primary Examiner* — Mohsen Ahmadi
(74) *Attorney, Agent, or Firm* — Baker Botts L.L.P.

(57) ABSTRACT

A method of fabricating a semiconductor device includes providing a substrate having a semiconducting surface and forming a first epitaxial layer on the semiconducting surface. The first epitaxial layer includes a first semiconducting material doped in-situ with at least one dopant of a first conductivity type. The method also includes adding at least one dopant of a second conductivity type into one portion of the substrate to define at least one counter-doped region with an overall doping of the second conductivity type and at least one other region with an overall doping of the first conductivity type in the other portions of substrate. The method further includes forming a second epitaxial layer on the first epitaxial layer, the second epitaxial layer being a second semiconducting material that is substantially undoped.

19 Claims, 4 Drawing Sheets

(51) Int. Cl.
*H01L 29/167* (2006.01)
*H01L 29/786* (2006.01)

(56) References Cited

U.S. PATENT DOCUMENTS

| | | | |
|---|---|---|---|
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A * | 3/2000 | Eaglesham et al. ........... 438/495 |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,300,209 B1 * | 10/2001 | Oh ............................... 438/370 |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 * | 6/2003 | Drobny et al. ................ 438/507 |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |

(56) References Cited

U.S. PATENT DOCUMENTS

| | | |
|---|---|---|
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,972,223 B2 | 12/2005 | Weimer et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,339,215 B2 | 3/2008 | Chidambaram |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,524,740 B1 | 4/2009 | Liu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,553,717 B2 | 6/2009 | Chakravarthi et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,631 B2 | 3/2010 | Murthy et al. |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |

(56) References Cited

U.S. PATENT DOCUMENTS

| | | |
|---|---|---|
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 | 9/2012 | Thompson et al. |
| 8,286,180 B2 | 10/2012 | Foo |
| 8,288,798 B2 | 10/2012 | Passlack |
| 8,298,901 B1* | 10/2012 | Foote et al. ............... 438/309 |
| 8,299,562 B2 | 10/2012 | Li et al. |
| 8,324,059 B2 | 12/2012 | Guo et al. |
| 8,569,156 B1* | 10/2013 | Scudder et al. ........... 438/527 |
| 2001/0014495 A1 | 8/2001 | Yu |
| 2002/0033511 A1 | 3/2002 | Babcock et al. |
| 2002/0042184 A1 | 4/2002 | Nandakumar et al. |
| 2002/0151153 A1* | 10/2002 | Drobny et al. ............ 438/492 |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0051104 A1* | 3/2004 | Yamashita et al. ............. 257/77 |
| 2004/0053457 A1 | 3/2004 | Sohn |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106800 A1* | 5/2005 | Haensch et al. ............ 438/199 |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0024876 A1 | 2/2006 | Chidambaram |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0138953 A1 | 6/2008 | Challa et al. |

(56) References Cited

U.S. PATENT DOCUMENTS

| | | |
|---|---|---|
| 2008/0169493 A1 | 7/2008 | Lee et al. |
| 2008/0169516 A1 | 7/2008 | Chung |
| 2008/0194069 A1 | 8/2008 | Surdeanu et al. |
| 2008/0197439 A1 | 8/2008 | Goerlach et al. |
| 2008/0199999 A1* | 8/2008 | Weijtmans et al. .......... 438/285 |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0079008 A1 | 3/2009 | Nandakumar et al. |
| 2009/0081858 A1 | 3/2009 | Qin et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0179280 A1 | 7/2009 | Kohli et al. |
| 2009/0224319 A1 | 9/2009 | Kohli |
| 2009/0278209 A1 | 11/2009 | Noda |
| 2009/0286367 A1 | 11/2009 | Krull et al. |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0078729 A1 | 4/2010 | Fukutome et al. |
| 2010/0100856 A1 | 4/2010 | Mittal |
| 2010/0133624 A1 | 6/2010 | Nandakumar et al. |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2010/0276761 A1 | 11/2010 | Tung et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175140 A1 | 7/2011 | Taylor et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1* | 12/2011 | Arghavani et al. .......... 257/368 |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0161210 A1 | 6/2012 | Heinrich et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2005/093831 | 10/2005 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809 -814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003.

(56) References Cited

OTHER PUBLICATIONS

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

\* cited by examiner

SEMICONDUCTOR DEVICES WITH DOPANT MIGRATION SUPPRESSION AND METHOD OF FABRICATION THEREOF

FIELD OF THE INVENTION

The present invention relates to semiconductor devices and methods of fabrication thereof, and more specifically to semiconductor devices with dopant migration suppression and methods of fabrication thereof.

BACKGROUND

In certain semiconductor devices, a structure is required in which a highly doped layer is disposed adjacent to a layer with a substantially lower doping. In certain cases, this arrangement can be problematic as such structures are potentially susceptible to dopant migration, via diffusion and other mechanisms. For example, when a first layer of silicon doped with boron (B) is formed adjacent to and located underneath a second layer of silicon that is undoped or has a significantly lower B doping concentration than the first layer, unwanted migration of B into the second layer can occur when a thermal treatment is applied during fabrication of the semiconductor device. Similar results have been observed for other dopants in silicon, such as phosphorus (P) and arsenic (As). As a result, the abrupt doping transition between differentially doped layers may be degraded or compromised by subsequent thermal processing. In a worst case, the dopant could diffuse completely through the second layer, altering the undoped nature of the second layer in its entirety. In either case, the electrical characteristics of the semiconductor device can be significantly altered when dopant migration occurs.

In an effort to avoid migration of highly mobile dopants, into undoped regions, development efforts have primarily focused on: (1) reducing the thermal budget during semiconductor device manufacturing processes and (2) the implantation of additional species to form blocking regions to inhibit the migration of dopants. For example, carbon (C) implants activated into substitutional lattice sites (such as by first performing a pre-amorphization followed by C implantation and recrystallization anneal) have been utilized to suppress migration of B and P in silicon.

Both of these efforts (lower thermal budgets and migration inhibitors) have met with some success, but still have drawbacks. With respect to thermal budget reductions, at least some thermal treatments will always be required and therefore the amount of thermal budget reduction is always limited. Additionally, variations in the manufacturing process can limit the effectiveness of the reduced thermal budget. In particular, defects and interstitial/vacancy pairs generated during normal semiconductor device processing can result in migration, even when a lower thermal budget is applied. Moreover, even if thermal budgets are accurately controlled, small amounts of unwanted dopant diffusion can still have a pronounced effect on devices with reduced dimensions or devices designed with low doping concentrations. In addition, some thermal steps can simply lose effectiveness if the temperature is lowered beyond a critical minimum value.

With respect to ion implantation of a migration inhibitor such as carbon, one potential issue is that there can be inaccuracies in the placement of the carbon species, resulting in some dopants being placed in undesirable locations or atoms missing from locations where the dopant diffusion protection is needed. As a result, some migration can occur due to the ineffectiveness of the ion implantation process leading to the imperfect placement of the species intended to suppress migration. Further, ion implantation processes can introduce additional contaminating impurities into the semiconductor device and additional implant damage. Either of these can adversely affect device performance. Moreover, the extra implantation steps can introduce additional costs to the manufacturing process.

In view of the foregoing, there is a need for an alternate approach for suppressing dopant migration in semiconductor devices.

DETAILED DESCRIPTION

Embodiments are described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide a full understanding of the embodiments. One having ordinary skill in the relevant art, however, will readily recognize that embodiments can be practiced without one or more of the specific details or with other methods. In other instances, well-known structures or operations are not shown in detail to avoid obscuring the embodiments. Embodiments are not limited by the illustrated ordering of acts or events, as some acts may occur in different orders and/or concurrently with other acts or events. Furthermore, not all illustrated acts or events are required to implement a methodology in accordance with the embodiments.

As noted above, dopant migration is a significant concern in various types of semiconductor devices that include low doped (or undoped) regions abutting highly doped regions. In such devices, electrical characteristics may be dependent on the formation of a sufficiently abrupt transition of dopants between the regions. One example of such a semiconductor device is the deeply depleted channel (DDC) transistor device.

DDC transistors are formed, for example, by forming a doped region in a well for CMOS devices by forming a heavily doped screen layer ($5 \times 10^{18}$ atoms/cm$^3$ to $1 \times 10^{20}$ atoms/cm$^3$). This can be followed by formation of a substantially undoped (that is, a material into which electrically modifying dopants are not purposely introduced) blanket epitaxial layer ($<5 \times 10^{17}$ atoms/cm$^3$) deposited over the screen layer, extending across multiple die and transistor die blocks.

Details regarding exemplary DDC transistor structures are more completely described in U.S. patent application Ser. No. 12/708,497 titled "ELECTRONIC DEVICES AND SYSTEMS, AND METHODS FOR MAKING AND USING THE SAME" and filed Feb. 18, 2010, U.S. patent application Ser. No. 12/971,884 titled "LOW POWER SEMICONDUCTOR TRANSISTOR STRUCTURE AND METHOD OF FABRICATION THEREOF" and filed Dec. 17, 2010, U.S. patent application Ser. No. 12/971,955 titled "TRANSISTOR WITH THRESHOLD VOLTAGE SET NOTCH AND METHOD OF FABRICATION THEREOF" and filed Dec. 17, 2010, U.S. patent application Ser. No. 12/895,785 titled "ADVANCED TRANSISTORS WITH THRESHOLD VOLTAGE SET DOPANT STRUCTURES" and filed Sep. 30, 2010, and U.S. patent application Ser. No. 12/895,813 titled "ADVANCED TRANSISTORS WITH PUNCH THROUGH SUPPRESSION" and filed Sep. 30, 2010, the disclosures of which are hereby incorporated by reference in their entirety.

Although the various embodiments will be described primarily with respect to DDC transistor devices, the various embodiments are not limited in this regard. That is, the various processes, structures and methods described herein are equally applicable to any other types of semiconductor device structures in which a highly doped region abuts a low doped or substantially undoped region, and there is the potential for migration from the doped region to the undoped region. Examples of devices designed in this manner are, super steep retrograde well devices and other depleted channel devices, or any device channel having heavily doped regions in contact with moderately doped to highly doped regions (such as traditional transistors with LDD or S/D implants adjacent to channel regions).

In depleted channel processes, the heavily doped region, which is called "well", is typically formed via implantation of dopants. The P-well typically uses B doping. Boron migration issues are typically managed via implantation of C and careful management of thermal budget. In the case of a DDC transistor, an exemplary process flow for forming the screen regions for the DDC NMOS device can begin with B implants into the P-well for the NMOS device regions. These implants are followed by a germanium (Ge) pre-amorphization implant into the NMOS device regions at an energy of about 20 keV to 60 keV and at a dose of about $1 \times 10^{14}$ to $1 \times 10^{15}$ atoms/cm$^2$. This Ge implant is then followed by a carbon (C) implant into the NMOS device regions at about 2 keV to 7 keV at a dose of about $1 \times 10^{14}$ atoms/cm$^2$ to $1 \times 10^{15}$ atoms/cm$^2$. Recrystallization anneal(s) are carried out. Separately, screen implants into the N-well for the DDC PMOS device regions, for instance, Sb or As, can be applied.

After at least the DDC NMOS implants are completed, an anneal process can be performed. The anneal process serves two purposes. First, the anneal process provides for recrystallization of the portion of the substrate amorphized by the Ge implants. This recrystallization results in at least some of the implanted C being integrated into the recrystallized substrate substitutionally. The substitutional C, in turn, prevents migration of the B atoms. Second, the anneal process serves to activate the implanted dopants for the DDC device.

The DDC process flow then continues, preferably with the formation of the substantially undoped blanket epitaxial silicon, formation of isolation features, formation of transistors and other devices thereon, and formation of interconnect features.

While the process flow above does provide some suppression of B migration in DDC structures and depleted channel structures, the reliance on an ion implantation-based process has several drawbacks. First, variations in the implant processes and numerous masking steps can result in an imperfect placement of the B and C implants, and their resulting profiles in the recrystallized substrate. For example, the implanted C region may be located below the layer of the implanted B atoms, rendering the C ineffective to prevent upward migration of B.

Second, although the anneal process following Ge pre-amorphization is intended to provide recrystallization of the substrate, such a process may not provide 100% recrystallization of the amorphized and mechanically damaged portions of the substrate. As a result, any defects remaining in the substrate can create leakage paths and reduce device yield. Additionally, such defects may provide migration paths for the B and other dopants into the epitaxial silicon layer as well as providing a source of interstitials and vacancies which can result in increased dopant diffusion coefficients for a given thermal budget.

Finally, as noted above, implant processes are well-known for introducing additional impurities. Such impurities can degrade performance and consequently reduce yields.

In view of the limitations of conventional migration suppression techniques, the various embodiments described below are directed to a process flow for suppressing dopant migration for semiconductor devices that consist of substantially undoped or low doped regions formed on a highly doped substrate. In particular, a process flow in accordance with the various embodiments provides for forming at least a portion of the highly doped regions by epitaxially depositing a layer of semiconductor material on the substrate that incorporates the electrically active dopant species, that is, via in-situ doping of the semiconductor material with the dopant species of concern. For example, in the case of a depleted channel device, this process can involve depositing a layer of B-doped silicon sufficient to form the well on the NMOS device. For the DDC device, this process can include depositing a layer of B-doped silicon with sufficient dopants to form the well and screen region for DDC devices. The advantage of such a configuration is that diffusion of such dopants is limited. In general, in the case of implanted dopants, diffusion is primarily due to the presence of point defects, self-interstitials, and vacancies in the semiconductor material that enhance the diffusivity of dopants such as boron and phosphorus. These "transient enhanced diffusion (TED) mechanisms" allow dopant atoms to more easily traverse the lattice of the semiconductor material during annealing.

The practical result of in-situ doping is that since the dopants are already incorporated into the semiconductor material, an activation anneal for such dopants is not needed. Also, in-situ doping can eliminate many of the point defects that result in TED. Further, even if some additional implants of a same conductivity type are still required to tune the device characteristics, the dopants provided in-situ will be less likely to diffuse during subsequent anneal processes. Therefore, the amount of the dopant available for diffusing into an adjacent undoped or low-doped layer is reduced compared with an all-implant method for introducing dopants into the substrate. An exemplary in-situ process is described below in greater detail with respect to FIGS. 1, 2A, 2B, 2C, and 2D.

Figure 1:
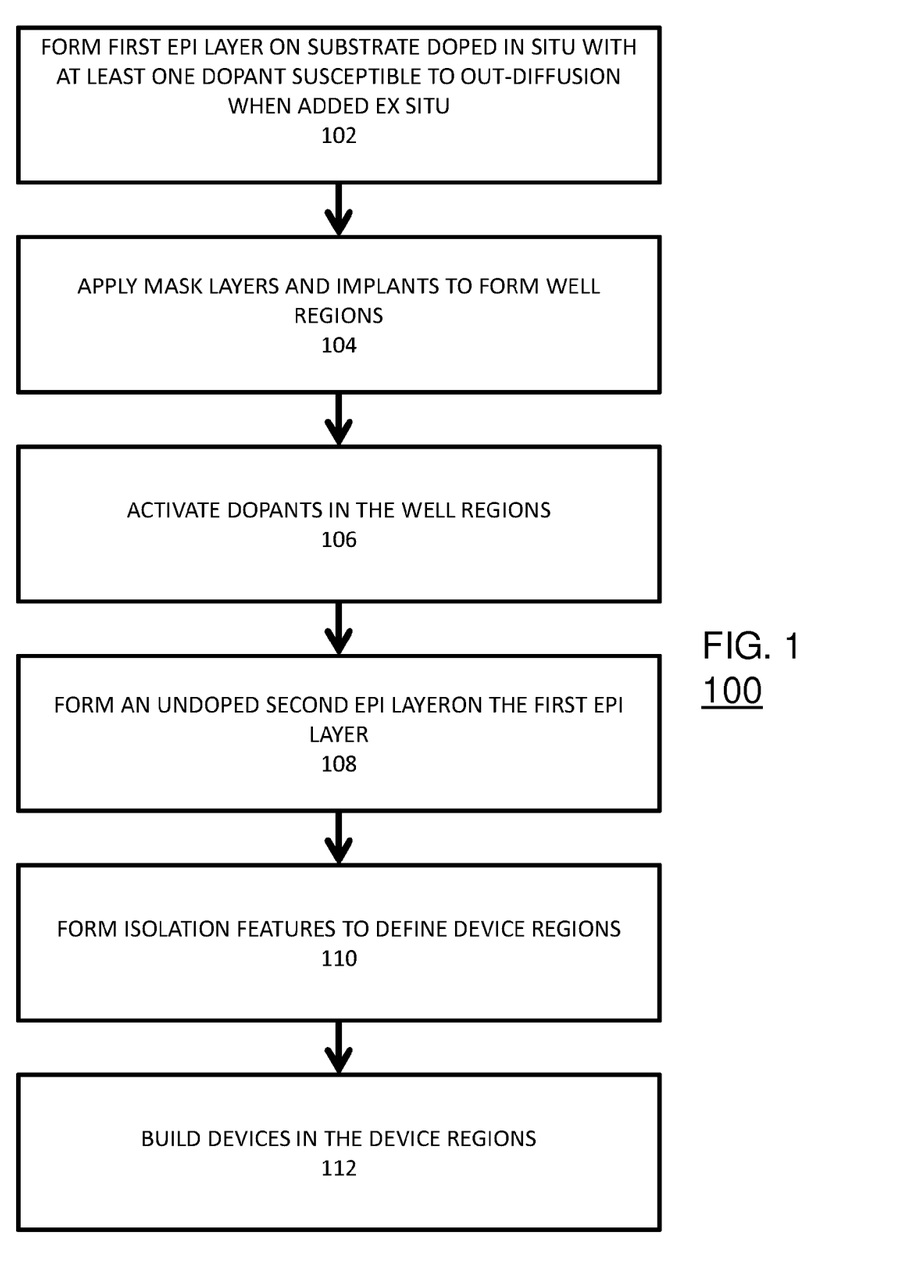
FIG. 1 is a flow chart of steps in an exemplary method in accordance with the various embodiments of the invention.

FIG. 1 is a flowchart of steps in an exemplary method 100 for fabricating semiconductor devices in accordance with the various embodiments. FIGS. 2A-2D are cross-sections showing the formation of DDC devices in accordance with a particular embodiment of the method described in FIG. 1.

Figure 2A:
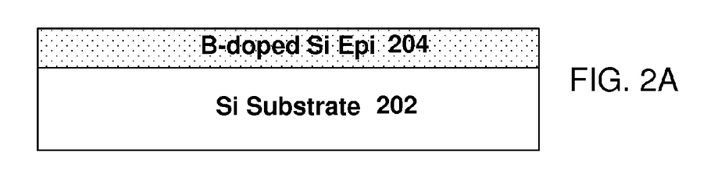
FIGS. 2A-2D are various views showing the results during various portions of the method in FIG. 1.

As shown in FIG. 1, the method 100 begins with the formation of a first epitaxial layer on a semiconducting substrate (step 102), where the first epitaxial layer includes at least one electrically active dopant. The dopant is added to the epitaxial process, and by forming the doped region using epitaxial growth, the likelihood of migration is reduced. A cartoon illustration for a DDC embodiment is provided at FIG. 2A-2D. As shown in FIG. 2A, a silicon substrate 202 is provided, on which an in-situ B-doped silicon epitaxial layer (B-doped Si epi) 204 is formed. The surface of B-doped Si epi 204 defines a new surface for the substrate 202.

Optionally, the deposition of the B-doped Si epi 204 can be preceded by an anti-punchthrough (APT) implant into the surface of substrate 202. For example, in the case of a Si-based DDC device, an NMOS APT implant can be provided by implanting B at an energy of about 10 keV to 30 keV at a dose of about $5\times10^{12}$ atoms/cm$^2$ to $5\times10^{13}$ atoms/cm$^2$. The B-doped Si epi 204 can then be formed.

In one embodiment, the B-doped Si epi 204 is formed by depositing a blanket layer by way of an epitaxial silicon process. The B doping can be selected to provide an appropriate doping level to define a heavily doped screen region for the P-well side of a to-be-formed device. In DDC embodiments, a B doping concentration between about $5\times10^{18}$ atoms/cm$^3$ and about $1\times10^{20}$ atoms/cm$^3$ can be provided, the particular doping concentration selected based upon desired device electrical characteristics of threshold voltage, junction leakage and other parametric considerations. In DDC embodiments, a B-doped Si epi layer of less than 10 nm can be formed, however, the thickness can be as high as 30 nm or more in some embodiments. Such a layer can be deposited using an epitaxial growth process that includes a boron doping source to provide the boron in-situ doping. For example, in particular embodiments, a chemical vapor deposition (CVD) process can be used, where B is provided by way of a suitable precursor gas, such as diborane; while disilane, silane, or dichlorosilane may be selected as the silicon precursor. In one particular embodiment, the epitaxial growth process can utilize processing temperatures of approximately 700C to 900C at a reduced pressure, for instance, 20 Torr.

Although the exemplary embodiments refer primarily to the forming of silicon-comprising layers with in situ B-doping, the various embodiments are not limited in this regard. In other embodiments, the first epitaxial layer can be doped in-situ with another type of electrically active dopant. For example, in the case of silicon-comprising materials, P can be incorporated in-situ in a similar manner as described herein.

Figure 2B:
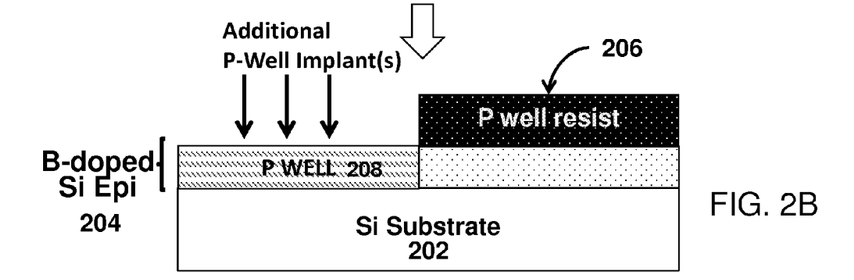
Figure 2C:
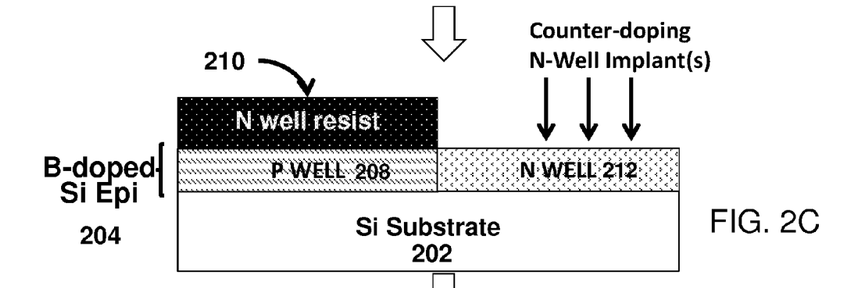

Referring back to FIG. 1, once the first epitaxial layer (B-doped Si epi 204) is formed, mask layers and implants can be utilized to apply any additional NMOS implants needed and to apply PMOS doped region implants, as shown in FIGS. 2B and 2C. FIG. 2B illustrates the application of optional additional implants for DDC NMOS devices and FIG. 2C illustrates the formation of doped regions for DDC PMOS devices. For purposes of describing the steps that take place after B-doped Si epi 204 is formed, it is noted that the B-doped Si epi 204 is treated as an extension of the substrate 202.

Optionally, as shown in FIG. 2B, additional implants 208 can be provided as needed to set the threshold voltage (Vth) and define other characteristics for the DDC NMOS devices. As shown in FIG. 2B, any additional NMOS implants can be applied via a process that includes formation of a patterned mask layer 206 to prevent dopants from being implanted into other regions of the substrate 202, such as PMOS regions. For example, as illustrated in FIG. 2B, the masking layer 206 shown as covering the PMOS region, can be formed by providing a layer of photoresist which is patterned with openings to expose the regions of the substrate 202 associated with the NMOS devices. However, the various embodiments are not limited in this regard and the masking layer 206 can be formed using a hard mask layer, alone or in combination with photoresist. Such a hard mask layer can be formed using layers of silicon oxide, silicon nitride, or any other suitable hard mask layers. Optionally, a blanket sacrificial protective oxide layer (not shown) can be formed prior to the formation of the masking layer 206. Such a layer can be an in-situ steam generated (ISSG) layer or any other type of sacrificial oxide layer sufficient to protect the substrate from unwanted effects of subsequent ion implantation. Appropriate implants, such as P-type conductivity implants, are then provided according to the types of the devices to be formed.

For instance, the process may begin with a boron (B) anti-punchthrough implant (if not performed prior to formation of B-doped Si epi 204) at an energy of about 10 keV to 30 keV at a dose of about $5\times10^{12}$ atoms/cm$^2$ to $5\times10^{13}$ atoms/cm$^2$, as well as a Boron implant at an energy of about 2 keV to 10 keV at a dose of about $1\times10^{12}$ atoms/cm$^2$ to $1\times10^{14}$ atoms/cm$^2$. Combined with the dopants already incorporated into the B-doped Si epi 204, such conditions will be generally suitable for the formation of DDC NMOS low Vth (NLVt) devices. Variations in energy, material, and dose for one or more of the implants discussed above may be applied depending on the specifications from the device design. Further, the implant conditions discussed above are presented solely for purposes of illustration and not by way of limitation. In the various embodiments, more or less implants can be used. Alternatively stated, other implants, other than those described above, can be utilized as well.

In some embodiments, instead of performing such implants, the additional dopants required for the NMOS devices can be added during the growth of the B-doped Si epi 204. For example, by varying the process conditions during growth of the B-doped Si epi 204, such as the ratio of dopant and silicon gases during a CVD process, the doping profile in the B-doped Si epi 204 can be tailored as needed. Accordingly, the well, screen, APT, and any other regions of the NMOS devices can be formed during formation of the B-doped Si epi 204.

Following the completion of the implants discussed above, additional patterned mask layers can be provided to apply additional implants to build out additional types of NMOS devices. For example, different sub-regions can be masked off to allow for preselected implants for the formation of NMOS standard Vth (NSVt) devices, NMOS SRAM devices in different sub-regions overlying the P-well. For each of these different device types, additional screen implants can be provided to change the Vth for each of these device types. NMOS analog devices can also be formed in the P-well by using appropriate implants. The doses and energies are selected to result in a targeted concentration of dopants and depth of doped region to provide a target Vth value for these devices. For instance, additional Boron may be implanted at an energy between about 2 keV to 10 keV at a dose of about $1\times10^{12}$ to $1\times10^{14}$ atoms/cm$^2$. However, the various embodiments are not limited to this particular configuration, and the implant conditions may vary as needed to meet the Vth requirements for the device design. The implant conditions for the additional screen implants discussed are provided solely for illustrative purposes. Any suitable set of implants can be used in the various embodiments. Further, different devices can utilize common implants. Accordingly, the masking layers can be configured during the implantation process to allow a same implant to be used for multiple device types.

Once the implants for the NMOS regions are completed, all of the NMOS devices are covered over with a mask so that the doped regions for the PMOS regions can be formed. However, in the various embodiments, the existing blanket B-doped Si epi 204 must be considered when applying such PMOS implants. Specifically, the various embodiments require higher implant doses to provide sufficient counter-doping and provide sufficient N-type doping for the PMOS device. In particular embodiments, the implant doses will need to be high enough to counter the B doping in the B-doped Si epi 204. For example, if the in-situ doping B concentration is $5\times10^{18}/cm^3$, and the final desired n-type concentration is $8\times10^{18}/cm^3$, then the n-type implant dose would need to be tailored to generate a peak concentration of $1.3\times10^{19}/cm^3$ ($8\times10^{18}/cm^3+5\times10^{18}/cm^3$). In this example, the final n-type activation would achieve a compensated $8\times10^{18}/cm^3$ n-type region.

For example, as shown in FIG. 2C, the P-well regions 208 are effectively masked off so that the PMOS device region 212 can be formed. For instance, the DDC process may begin with a phosphorous N-well implant at about 200 keV to 450 keV at a dose of about $5\times10^{12}$ atoms/cm$^2$ to $1\times10^{14}$ atoms/cm$^2$. The individual devices can include arsenic or antimony anti-punchthrough implants at an energy of about 50 keV to 200 keV at a dose of about $5\times10^{12}$ atoms/cm$^2$ to $1\times10^{14}$ atoms/cm$^2$. A DDC implant, for instance, arsenic at an energy of about 2 keV to 10 keV at a dose of about $2\times10^{12}$ atoms/cm$^2$ to $2\times10^{14}$ atoms/cm$^2$ can be used to form the screen/Vt region for the DDC transistor. Variations of energies, materials and doses may apply depending on the target Vth and other specifications for the device design.

Then, optionally, and similar to the process described above with respect to FIG. 2B, additional patterned mask layers can be formed to cover devices to be protected to allow for additional screening implants to be performed for the higher Vth devices which are formed using heavier concentrated regions, such as PMOS standard Vth (PSVt) values, PMOS SRAM devices, and PMOS analog devices. For instance, additional arsenic or antimony may be implanted at an energy of about 2 keV to 10 keV at a dose of about $2\times10^{12}$ atoms/cm$^2$ to $2\times10^{14}$ atoms/cm$^2$. The doses and energies are selected to result in a targeted concentration of dopants and depth of doped region to provide target Vth values for each type of device. The masking layers can be configured during the implantation process to allow a same implant to be used for multiple device types. The particular implant materials and conditions provided and the mask patterns presented are provided solely for purposes of illustration and are not intended to limit the various embodiments in any regard.

Referring back to FIG. 1, after the implants are completed for the devices within the P-well 208 and N-well 312 regions (step 104), any remaining photoresist or other mask material and any remaining sacrificial oxide should be removed to expose the semiconducting surface including the implanted regions. Thereafter, the implanted dopants can be activated via an anneal process (step 106).

In the various embodiments, any type of anneal/activation process can be utilized. However, what is significant regarding the various embodiments is that since the Ge amorphization implant is no longer performed, the anneal process no longer requires the use of a regrowth or recrystallization anneal which requires a moderately high to high temperature over an extended period of time. Accordingly, the present disclosure contemplates that the anneal process following the formation of the NMOS and PMOS device regions can be skipped or performed via the use of a relatively low thermal budget anneal, effective to activate any implanted species and repair any local damage caused by the ion implantation.

Figure 2D:
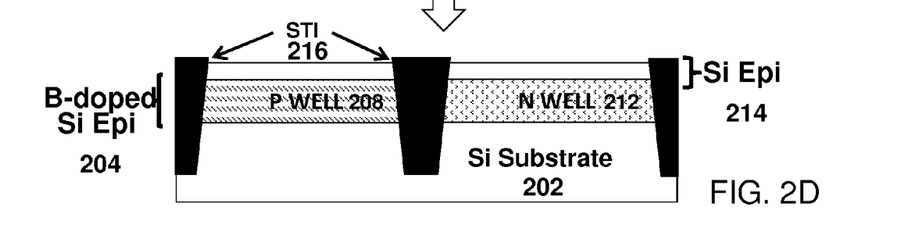

The result of the foregoing process is that since the amount of B available to diffuse into the Si epi 214 is significantly reduced, the amount of migration into subsequently formed layers is also significantly reduced. Moreover, the higher-dose B implant processes (e.g., APT) are carried out at high energies, resulting in such high dose being located far from the interface between Si epi 214 and B-doped Si epi 204. Further, any additional migration due to the defects from incompletely recrystallized portions of the substrate and due to the thermal budget for recrystallization is no longer a concern.

Referring back to FIG. 1, once the dopants are activated (step 106), a second epitaxial layer 214 that is undoped (that is, does not include in its process conductivity-altering dopants) or doped to a pre-determined concentration can be formed over the B-doped Si epi 204 on the substrate 202 (step 108). The second epitaxial layer 214 can be a blanket layer formed by way of an epitaxial silicon process. The thickness of the second epitaxial layer 214 can be selected based on desired device characteristics. For example, in one particular embodiment, a silicon epitaxial layer between 10 nm and 40 nm, such as 15 nm can be formed. Such a layer can be deposited using an epitaxial growth process, where the processing temperatures, the deposition time, or both are selected such that significant migration of previously implanted material is minimized. In one particular embodiment, the epitaxial growth process can utilize processing temperatures of approximately 600C. However, the various embodiments are not limited in this regard. In other embodiments, depending on process conditions, device targets, and other factors, the thickness and doping levels of the second epitaxial layer 214 can vary.

The present disclosure contemplates that as part of the process of forming devices in active areas or regions of the semiconducting surface, some type of active area isolation is provided. Accordingly, following the formation of the second epitaxial layer 214 (step 108), isolation features can be formed to define different device regions (step 110). The result of this process is illustrated in FIG. 2D. FIG. 2D shows how shallow trench isolation (STI) features 216 can be formed after the formation of second epitaxial layer 214. However, the various embodiments are not limited to STI features and any other types of active area isolation features can be used with the various embodiments. In the various embodiments, the STI features 216 can be used not only to define separate NMOS and PMOS active areas, but additional STI features can be provided to define separate SVT, LVT, SRAM, and analog devices in the PMOS and NMOS device regions. Following the formation of these isolation features, processing of the substrate can then continue on to complete the transistor devices in the PMOS and NMOS device regions (step 112).

In the embodiments described above, the present disclosure contemplates that by reducing the amount of B introduced via implantation, the amount of B interstitials and silicon interstitial/vacancy pairs available to diffuse into the Si epi 214 are reduced. However, in some embodiments, additional NMOS implants may still lead to unwanted B diffusing into the Si epi 214. Moreover, some of the B incorporated into the B-doped Si epi 204 may still diffuse in to the Si epi 214 during anneal processes.

Accordingly, in particular embodiments, a barrier material-enhanced epitaxial layer is contemplated. More specifically, the first epitaxial layer deposited on the substrate can include a barrier material incorporated therein, such as carbon, selected in amounts aimed at suppressing migration of a dopant species. Two alternative exemplary processes are described below with respect to FIGS. 3A-3D.

Figure 3A:
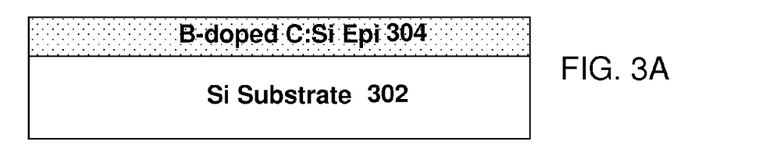
FIGS. 3A-3D are various views showing the results during various portions of an alternate embodiment of the exemplary process flow of FIG. 1.

FIGS. 3A-3D show the result of an alternate embodiment of the exemplary process flow of FIG. 1. The process can begin in a manner substantially similar to that described for FIG. 1. That is, a substrate can be provided and a first epitaxial layer can be formed thereon, as described with respect to step 102. However, in one alternate process, the in-situ doped Si epi includes both B doping and C doping to incorporate C into the B:Si epitaxial layer to inhibit migration of the boron. As shown in FIG. 3A, a silicon substrate 302 can be provided and thereafter a B-doped C:Si epi layer 304 can be formed. The B doping can be selected to provide an appropriate doping level to define the needed doping levels for the NMOS region, including the desired concentration for screen region in the case of a DDC transistor, as previously described.

The amount of C incorporated substitutionally into the silicon epitaxial layer can vary. In one particular embodiment, the substitutional C concentration can be selected such that it is less than or equal to 1% in silicon. For example, the concentration of substitutional C may typically be selected to be in the range of between about $1 \times 10^{19}$ atoms/$cm^3$ and about $1 \times 10^{21}$ atoms/$cm^3$. The B-doped C:Si epi 304 can be formed by introducing a C doping source in-situ into the B in situ-doped epitaxial process, and forming a blanket layer. In particular embodiments, a B-doped C:Si epi layer of less than 5 nm can be formed, however, the thickness can be as high as 20 nm or more in some embodiments. Such a layer can be deposited using a single epitaxial growth process. For example, in particular embodiments, a chemical vapor deposition (CVD) process can be used, where C is provided by way of a suitable precursor gas, such as methylsilane, and B is provided by way of a suitable precursor gas, such as diborane. In one particular embodiment, the epitaxial growth process can utilize processing temperatures of approximately 750C.

Figure 3B:
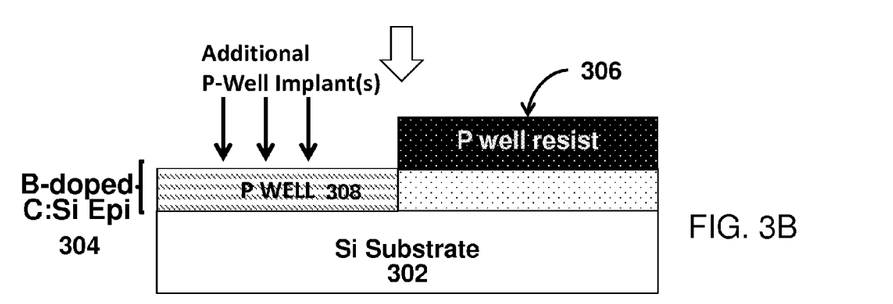

The result of the foregoing process is that not only are NMOS regions defined via an epitaxial deposition process rather than via implants, but subsequent B migration from the B-doped C:Si epi 304 is suppressed through the incorporation of C into the layer. As described above, the B doping can be selected such that no additional implants are needed for NMOS devices. However, as described above, the present disclosure also contemplates that some additional B implants may be needed for some types of devices. Thus additional masking and implants can be required, as illustrated in FIG. 3B and as described above with respect to FIG. 2B. That is, a patterned masking layer 306 can be defined (and optionally a sacrificial oxide) and implants for the additional NMOS devices 308 can be applied. As shown in FIG. 3B, the masking layer 306 can be photoresist. However, as noted above, other masking layers can be utilized as well to subdivide the device regions to form discrete additional devices of varying Vth levels by way of additional implants all performed prior to a subsequently deposited substantially undoped epitaxial Si layer.

Figure 3C:
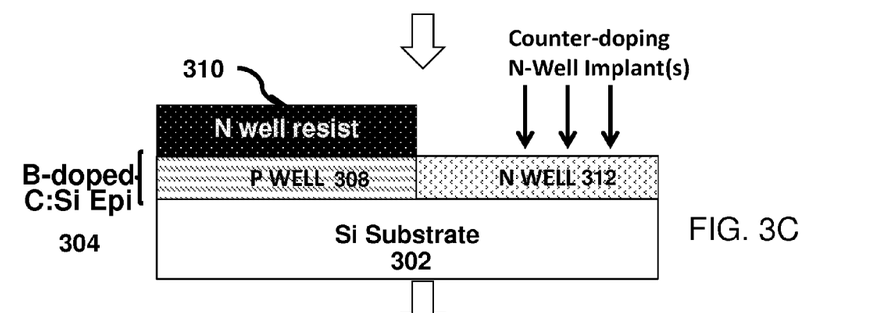

Once the NMOS region 308 is formed, via formation of B-doped C:Si epi 304 alone or in combination with one or more implants, the PMOS region 312 can be formed, as shown in FIG. 3C. This process can be performed in substantially the same manner as described above with respect to FIGS. 2A-2D. That is, a patterned masking layer 310 can be defined (and optionally a sacrificial oxide) and implants for PMOS devices 312 can be applied. As shown in FIG. 3C, the masking layer 310 can be photoresist. However, as noted above, other masking layers can be utilized as well.

As noted above, the presence of the blanket B-doped C:Si epi 304 will require different implant doses for the PMOS region than those previously described. Specifically, higher implant doses will be required in order to provide sufficient counter-doping to the in-situ B doping and provide sufficient N-type doping for the PMOS region. In particular embodiments, the implant doses will need to be high enough to counter the B doping in the B-doped Si epi 304. For example, if the in-situ doping B concentration is $5 \times 10^{18}$/$cm^3$, and the final desired n-type concentration is $8 \times 10^{18}$ atoms/$cm^3$, then the n-type implant dose would need to be tailored to generate a peak concentration of $1.3 \times 10^{19}$/$cm^3$ ($=8 \times 10^{18} + 5 \times 10^{18}$). In this example, the final n-type activation would achieve a compensated $8 \times 10^{18}$/$cm^3$ n-type region.

Figure 3D:
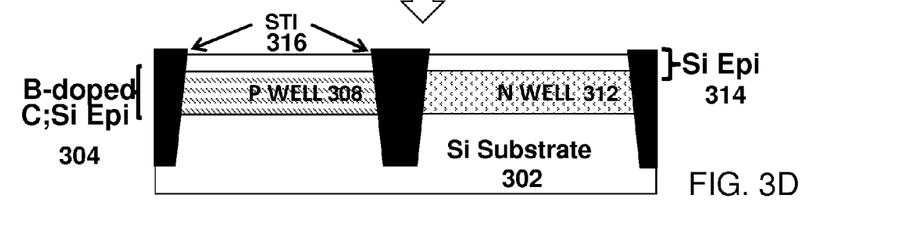

After the implants are completed for the device regions 308 and 312, any remaining photoresist or other mask material (and any remaining sacrificial oxide) should be removed to expose the semiconducting surface including the implanted regions. The implanted dopants can then be activated via an anneal process, though without a recrystallization anneal, as previously described. Finally, the second epitaxial layer 314 and isolation features 316 can be formed, as discussed above with respect to FIGS. 2A-2D. For example, as shown in FIG. 3D, a silicon comprising epitaxial layer 314 can be formed, followed by formation of STI features 316. The process can then proceed to the building of devices in the P-well 308 and N-well 312 regions.

A further alternative process is, instead of incorporating the carbon into the in-situ doped B epitaxial process, to carry out the B in-situ doped epitaxial process first, and then follow with a C in-situ doped epitaxial process. An extra layer of epitaxial material is therefore contemplated, the in-situ B doped epitaxial layer, the in-situ C doped epitaxial layer and the substantially undoped epitaxial layer formed preferably after the NMOS and PMOS device regions have been doped. If a C in-situ doped epitaxial layer is used, then the C concentration is selected so that the C is effective to inhibit migration of doped species in particular, boron, while keeping the thickness of the C in-situ doped epitaxial layer to a minimum. The thickness of the C in-situ doped epitaxial layer can be as little as 5 nm or less, but may need to be thicker to ensure the effectiveness of the layer to inhibit diffusion. Following the deposition of the C in-situ doped epitaxial layer, the substantially undoped epitaxial silicon layer can be formed. Advantageously, by the process described in this embodiment, the C-doped region is restricted to the bottom portion of the transistor channel. The substantially undoped epitaxial silicon layer can remain such and be devoid of carbon constituents. In this example, the final thickness of the undoped epitaxial silicon layer can be adjusted to take into account the thickness of the C doped diffusion inhibiting layer. For example, if the C doped layer were 5 nm, and the final desired thickness of the channel were 25 nm, then 20 nm of undoped epitaxial silicon can be grown over the 5 nm carbon doped layer giving rise to a 25 nm channel region free from intentional n-type or p-type dopants. The described process incorporating a separate C in-situ doped epitaxial layer can be used in combination with a C-doped in situ-B epitaxial layer underneath as well.

Figure 4:
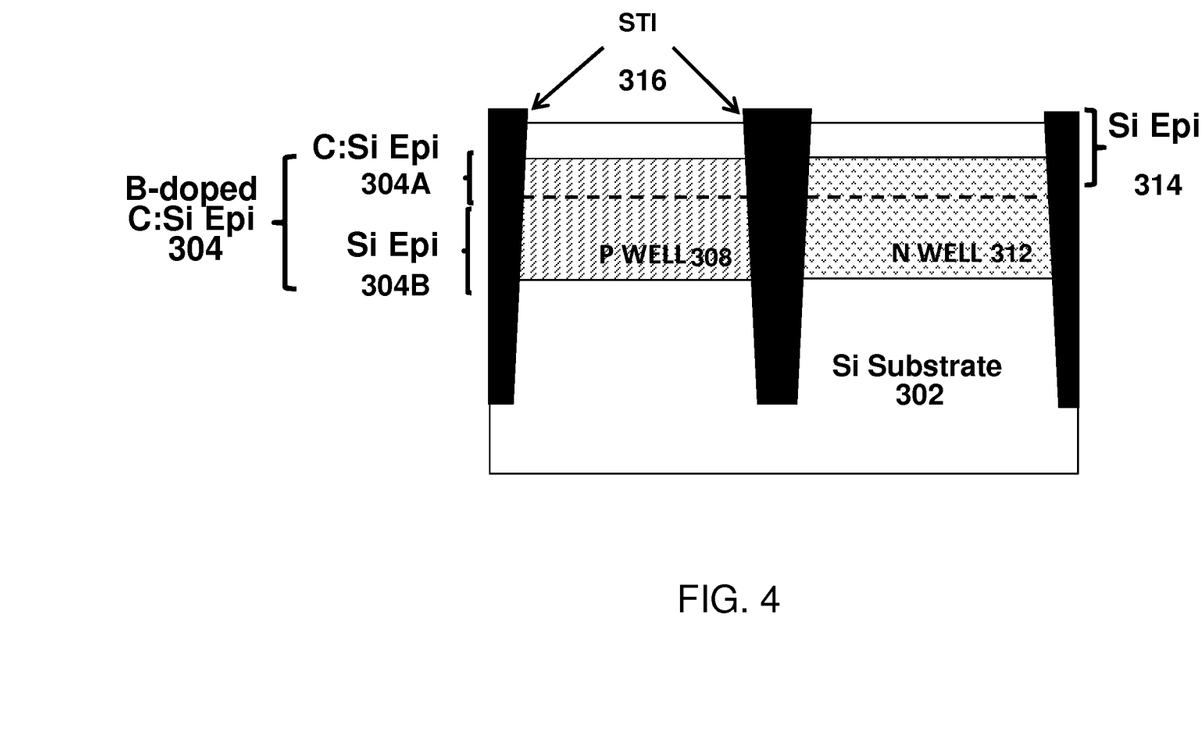
FIG. 4 shows the result of the alternate embodiment of the method in FIG. 3.

The various embodiments described above contemplate that the B and C incorporated in-situ will result in a profile of B and C along a vertical direction normal to the substrate 302 in which the amount of C and B is approximately the same or equal throughout the thickness of the B-doped C:Si epi 304. As used herein, the terms "approximately the same" or "approximately equal" refer to the measurement being compared as having a relative difference of 10% or less. In some embodiments, the amount of C, B, or both can vary along the thickness of the B-doped C:Si epi 304. That is, the amount of C or B can vary along a vertical direction normal to the substrate 302 such that the amount of C, B, or both is not approximately the same along this vertical direction. For example, as shown in FIG. 4, the C-doped portion can be restricted only to a portion of the B-doped C:Si epi 304. FIG. 4 is an alternate view of FIG. 3C, in which the silicon epitaxial layer is not uniform, after STI formation. As shown in FIG. 4, the C comprising portion of the B-doped C:Si epi 304 is restricted to the upper portion of the layer. For example, this can be the first 5-40 nm of the layer. The remaining portion of the layer can then be substantially free of C. Thus, B-doped C:Si epi 304 is formed by first defining a B-doped portion (B-doped Si Epi 304B) and a C comprising portion (C:Si Epi 304A). Such a structure can be achieved during a silicon epitaxial process by separate deposition processes or via adjustment of the ratios of silicon, C, and B precursor gases and other parameters during a single deposition process. In some embodiments, both portions 304A and 304B can be B-doped. In other embodiments, only portion 304B is B-doped. Further, the amount of C or B in each of these portions can also be varied.

The present disclosure also contemplates that in some cases, it may be undesirable to include a C-comprising portion for certain types of devices. For instance, whereas C incorporation is important to inhibit B migration on the NMOS side, the presence of C anywhere in the PMOS region may be problematic. If it is desired to exclude C in the PMOS regions, then, after forming the blanket B-doped Si epitaxial layer and the subsequent blanket C-doped Si epitaxial layer, then the NMOS regions can be masked leaving the PMOS regions exposed, whereupon a selective etch process can be used to remove the in-situ C-doped layer from the PMOS region. This etching can be performed as follows. First, a patterned masking layer can be formed to expose the regions of C-comprising portions to be etched. In some embodiments, the masking layer can consisting of a single layer of photoresist. In other embodiments, the masking layer can consist of a hard mask, separately or in combination with the photoresist layer. Such a hard mask can be a layer of silicon oxide, silicon nitride, or any other material which will be resistant to the removal process to be used for the epitaxial layer.

Once the pattern is formed, a selective removal process is utilized to reduce the thickness of the C-comprising portions. As used herein, the term "selective removal process" refers to any type of removal process that preferentially removes one type of material over another type of material. This can include, but is not limited to, any type of wet or dry, chemical, physical, or plasma-based etch processes for removing materials. In the case of C:Si epi, the selective removal process would be configured to preferentially remove C:Si epi over photoresist material and other masking materials. As noted above, the specific process for the selective removal process can vary depending on the amount of material to be removed and the amount of epitaxial layer thickness variability permitted. After the selective removal process is performed, the photoresist or other masking layer can be removed to expose the surfaces of the semiconducting surface.

This etching process can be performed at various points in the method of FIG. 1. In some embodiments, this process can occur prior to implants being performed (i.e., before step 104). In other embodiments, this process can occur after the implants, but prior to the formation of the second epitaxial layer (i.e., before step 108). Preferably, the selective etching of the C-containing portion should be performed prior to implanting the PMOS region with the N-type dopants. The exact point at which such a process is performed can vary depending on the desired device characteristics. Note that a further alternative to selective etching process is to use selective etching to remove B-containing layers from the PMOS side as well. A consequence of this selective etching is that the height of the substantially undoped epitaxial silicon layer will vary across the surface of the substrate. If desired, the substantially undoped epitaxial layer can be grown and/or then polished back to maintain a substantially planar top surface. Another alternative technique to selectively etching the carbon doped epitaxial material from PMOS devices could be to deposit the carbon doped epitaxial material selectively on the NMOS device regions. The in-situ doping and implant doses need to be adjusted to accommodate the expected final thickness of the substantially undoped epitaxial layer so that Vth can be set accurately. In the event that further Vth tuning is desired, channel implants or pocket implants known as "halo" following the formation of the substantially undoped epitaxial layer can be used.

While various embodiments have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of fabricating a semiconductor device, comprising:
   providing a substrate having a semiconducting surface;
   forming a first epitaxial layer on the semiconducting surface, the first epitaxial layer comprising a first semiconducting material doped in-situ with one or more first dopants to provide a first doping concentration throughout a thickness of the first epitaxial layer corresponding to at least a doping concentration for a MOSFET well region of a first conductivity type and that is different from a doping concentration of the semiconducting surface;
   adding one or more second dopants into one portion of the first epitaxial layer to define at least one counter-doped region extending through the thickness of the first epitaxial layer and having a second doping concentration corresponding to a doping concentration for a MOSFET well region of the second conductivity type and that is different from the doping concentration of the semiconducting surface; and forming a second epitaxial layer on the first epitaxial layer, the second epitaxial layer comprising a second semiconducting material that is substantially undoped.

2. The method of claim 1, wherein the step forming of the first epitaxial layer comprises incorporating at least one migration inhibiting material into the semiconducting material in situ.

3. The method of claim 1, further comprising the step of forming at least one electrical isolation feature extending through at least the first epitaxial layer and the second epitaxial layer to define a plurality of regions for a plurality of devices.

4. The method of claim 1, further comprising the step of forming a third epitaxial layer between the first epitaxial layer and the second epitaxial layer, the third epitaxial layer comprising semiconducting material incorporating at least one migration inhibiting material into the semiconducting material in-situ.

5. The method of claim 1, further comprising:
prior to the forming of the second epitaxial layer, adding, via an ex-situ process, at least one additional dopant of the first conductivity type into at least a portion of the other regions outside the at least one counter-doped region.

6. The method of claim 1, wherein the forming of the first epitaxial layer comprises selecting the first doping concentration to be substantially uniform throughout the first epitaxial layer.

7. The method of claim 1, wherein the first semiconductor material and the second semiconductor material comprise silicon.

8. A method of fabricating a semiconductor device, comprising:
providing a substrate having a silicon-comprising surface;
forming a first epitaxial layer extending across the surface of the substrate, the first epitaxial layer comprising silicon-comprising material doped in-situ with one or more first dopants to provide a first doping concentration throughout a thickness of the first epitaxial layer corresponding to at least a doping concentration for a MOSFET well region of a first conductivity type and that is different from a doping concentration of the silicon-comprising surface;
implanting one or more second dopants into a portion of the first epitaxial layer to define at least one counter-doped region throughout the thickness of the first epitaxial layer having a second doping concentration corresponding to a doping concentration for a MOSFET well region of the second conductivity type and that is different from a doping concentration of the silicon-comprising surface;
forming a second epitaxial layer extending over the first epitaxial layer, the second epitaxial layer comprising substantially undoped semiconductor material; and
forming at least one isolation feature extending through at least the first epitaxial layer and the second epitaxial layer to define at least one MOSFET device area of the second conductivity type from the at least one counter-doped region and at least one MOSFET device area of the first conductivity type from other regions outside the at least one counter-doped region.

9. The method of claim 8, wherein the forming of the first epitaxial layer comprises in-situ incorporation of carbon into at least one barrier portion of the first epitaxial layer.

10. The method of claim 9, wherein the at least one barrier portion is disposed substantially at an interface of the first epitaxial layer and the second epitaxial region.

11. The method of claim 8, wherein the at least one barrier portion is substantially free of the at least one dopant of the first conductivity type.

12. The method of claim 8, wherein at least one of the first dopants comprises boron.

13. The method of claim 8, further comprising:
prior to the forming of the second epitaxial layer, adding, via an ex-situ process, at least one additional dopant of the first conductivity type into at least a portion of the other regions outside the at least one counter-doped region.

14. A method of fabricating a semiconductor device, comprising:
providing a substrate having a silicon surface;
forming a first epitaxial layer on the silicon surface, the first epitaxial layer comprising silicon doped in-situ with at least boron and having a doping concentration throughout a thickness of the first epitaxial layer corresponding to a doping concentration for a P-type well region for a NFET device and that is different from a doping concentration of the silicon surface;
adding an amount of at least one N-type dopant into a portion of the substrate first epitaxial layer to define at least one counter-doped region having a doping concentration throughout the thickness of the first epitaxial layer corresponding to a doping concentration for a N-type well region for a PFET device and that is different from the doping concentration of the silicon surface;
forming a second epitaxial layer on the first epitaxial layer, the second epitaxial layer comprising substantially undoped silicon; and
forming at least one isolation feature extending through at least the first epitaxial layer and the second epitaxial layer to define at least one PFET device region in the at least one counter-doped region and at least one NFET device region outside the at least one counter-doped region.

15. The method of claim 14, wherein the forming of the first epitaxial layer comprises in-situ incorporation of carbon into at least one barrier portion of the first epitaxial layer.

16. The method of claim 15, wherein the at least one barrier portion is disposed substantially at an interface of the first epitaxial layer and the second epitaxial region.

17. The method of claim 15, wherein the at least one barrier portion is substantially free of boron.

18. The method of claim 14, further comprising:
prior to the forming of the second epitaxial layer, adding, via an ex-situ process, at least one additional P-type dopant into at least a portion of the other regions outside the at least one counter-doped region.

19. The method of claim 14, wherein the forming of the first epitaxial layer comprises selecting an amount of the boron to be approximately the same throughout the first epitaxial layer in a direction normal to the silicon surface.

* * * * *